(12) United States Patent
Pu et al.

(10) Patent No.: US 10,269,720 B2
(45) Date of Patent: Apr. 23, 2019

(54) INTEGRATED FAN-OUT PACKAGING

(71) Applicant: Taiwan Semiconductor Manufacturing Co., Ltd., Hsin-Chu (TW)

(72) Inventors: Han-Ping Pu, Taichung (TW); Hsiao-Wen Lee, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/360,739

(22) Filed: Nov. 23, 2016

(65) Prior Publication Data

US 2018/0145032 A1 May 24, 2018

(51) Int. Cl.
*H01L 23/02* (2006.01)
*H01L 23/538* (2006.01)
*H01L 23/00* (2006.01)
*H01L 21/768* (2006.01)
*H01L 21/683* (2006.01)
*H01L 23/31* (2006.01)
(Continued)

(52) U.S. Cl.
CPC ...... *H01L 23/5389* (2013.01); *H01L 21/6835* (2013.01); *H01L 21/76802* (2013.01); *H01L 21/76877* (2013.01); *H01L 21/76885* (2013.01); *H01L 21/76895* (2013.01); *H01L 24/16* (2013.01); *H01L 24/19* (2013.01); *H01L 24/20* (2013.01); *H01L 24/81* (2013.01); *H01L 21/568* (2013.01); *H01L 23/3128* (2013.01); *H01L 23/49816* (2013.01); *H01L 23/5384* (2013.01); *H01L 23/5386* (2013.01); *H01L 2221/68359* (2013.01); *H01L 2224/024* (2013.01); *H01L 2224/0239* (2013.01); *H01L 2224/02379* (2013.01); *H01L 2224/13014* (2013.01); *H01L 2224/13016* (2013.01); *H01L 2224/13024* (2013.01); *H01L 2224/16225* (2013.01); *H01L 2224/211* (2013.01); *H01L 2224/215* (2013.01); *H01L 2224/73267* (2013.01); *H01L 2924/01029* (2013.01); *H01L 2924/06* (2013.01); *H01L 2924/0665* (2013.01); *H01L 2924/07025* (2013.01)

(58) Field of Classification Search
CPC . H01L 2224/02379; H01L 2224/02373; H01L 23/481; H01L 23/5384; H01L 2225/1058; H01L 25/0857
USPC ......................................... 257/686, 777, 778
See application file for complete search history.

(56) References Cited

U.S. PATENT DOCUMENTS 8,742,579 B2 * 6/2014 Pagaila ................ H01L 21/568
257/686
8,779,606 B2 * 7/2014 Yim ........................ H01L 23/10
257/686

(Continued)

*Primary Examiner* — S. V. Clark
(74) *Attorney, Agent, or Firm* — Duane Morris LLP

(57) ABSTRACT

The present disclosure provides a packaged device that includes a first dielectric layer; a second dielectric layer, formed over the first dielectric layer, that includes a device substrate and a via extending from the first dielectric layer and through the second dielectric layer; and a third dielectric layer, formed over the second dielectric layer, that includes a conductive pillar extending through the third dielectric layer, wherein the conductive pillar is electrically coupled to the via of the second dielectric layer.

20 Claims, 18 Drawing Sheets

(51) Int. Cl.
    *H01L 21/56*        (2006.01)
    *H01L 23/498*       (2006.01)

(56)            References Cited

U.S. PATENT DOCUMENTS

| | | | | |
|---|---|---|---|---|
| 8,829,686 B2* | 9/2014 | Hong | .................... | H01L 23/498 |
| | | | | 257/686 |
| 8,872,319 B2* | 10/2014 | Kim | ....................... | H01L 25/16 |
| | | | | 257/686 |
| 8,896,109 B2* | 11/2014 | Pagaila | ................... | H01L 25/16 |
| | | | | 257/678 |
| 8,963,311 B2* | 2/2015 | Zhao | .................... | H01L 25/105 |
| | | | | 257/686 |
| 2003/0127724 A1* | 7/2003 | Senba | ............... | H01L 21/76898 |
| | | | | 257/698 |
| 2005/0184377 A1* | 8/2005 | Takeuchi | ............ | H01L 21/6835 |
| | | | | 257/686 |
| 2008/0136004 A1* | 6/2008 | Yang | ....................... | H01L 24/96 |
| | | | | 257/686 |
| 2011/0186973 A1* | 8/2011 | Pagaila | ................ | H01L 23/552 |
| | | | | 257/660 |
| 2011/0285007 A1* | 11/2011 | Chi | .................... | H01L 21/4846 |
| | | | | 257/686 |

* cited by examiner

INTEGRATED FAN-OUT PACKAGING

RELATED APPLICATIONS

This application claims priority under 35 U.S.C. 119 to U.S. Provisional Patent Application No. 62/373,218, filed on Aug. 10, 2016 and entitled "Integrated Fan-Out Packaging," the entirety of which is incorporated by reference herein.

BACKGROUND

Since the invention of integrated circuits, the semiconductor industry has experienced continuous rapid growth due to constant improvements in the integration density of various electronic components (e.g., transistors, diodes, resistors, capacitors, etc.). For the most part, these improvements in integration density have come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DICs) were thus formed, wherein two dies or packages may be stacked, with through-silicon vias (TSVs) formed in one of the dies or packages to connect the other die to another substrate. Package on Package (PoP) is becoming an increasingly popular integrated circuit packaging technique because it allows for higher density electronics. However, conventional PoP generally requires using a hybrid coupling method (e.g., a combination of a BGA method and a wire bonding method) to stack two or more dies or packages. Accordingly, a variety of characteristics (e.g., the number of electrical contacts, the electrical performance, stiffness, etc.) of the packaged dies/packages may be disadvantageously affected.

Figure 1:
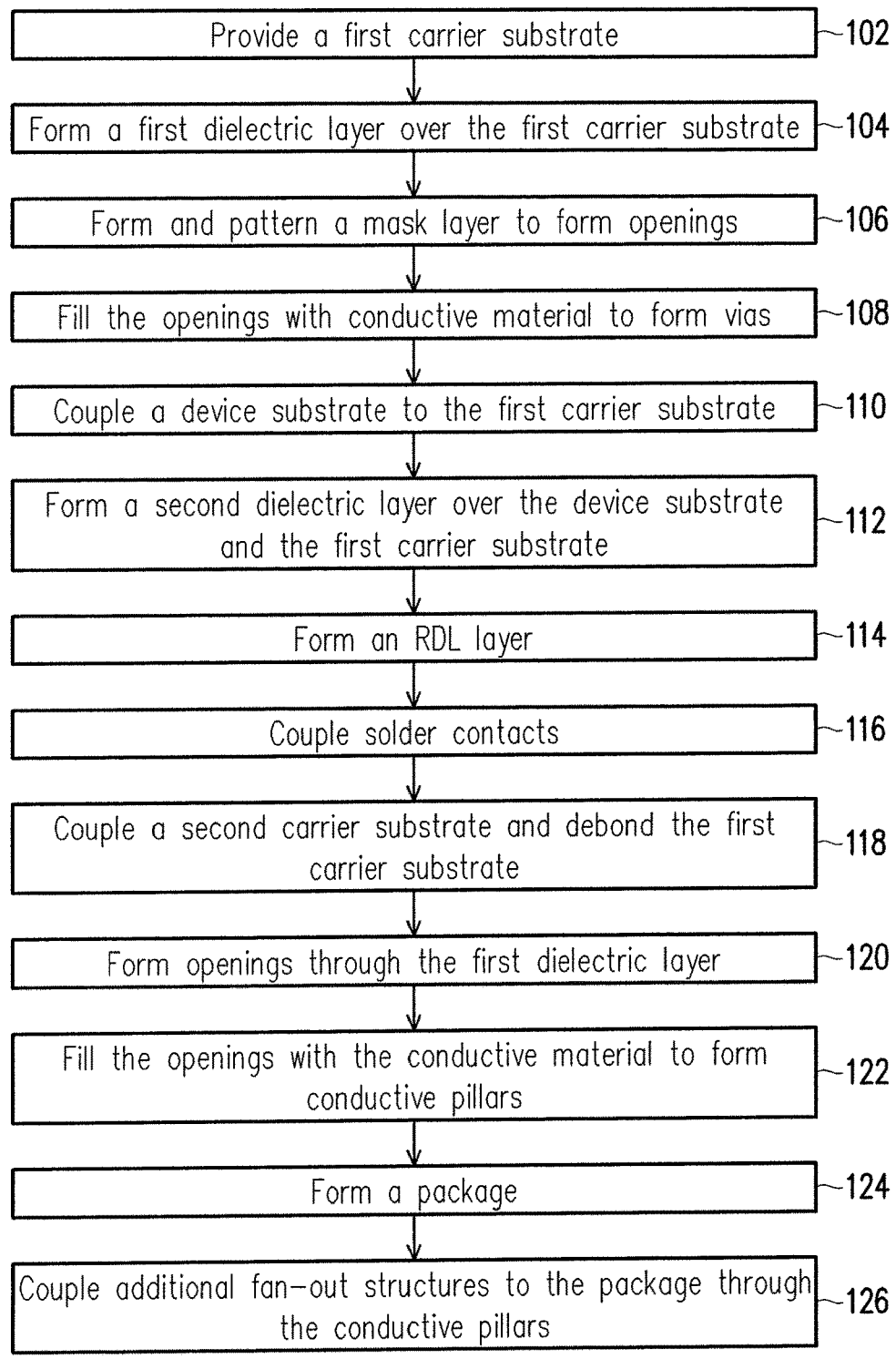
FIG. 1 is a flow chart of a method to form a packaged device substrate (package) to which one or more fan out structures are stacked, in accordance with some embodiments of the present disclosure.

All drawings are schematic and are not to scale.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

Referring now to FIG. 1, a flow chart of a method 100 of packaging a semiconductor device (chip) is illustrated according to various aspects of the present disclosure. The method 100 is merely an example, and is not intended to limit the present disclosure. Additional operations can be provided before, during, and after the method 100, and some of the described operations can be replaced, eliminated, or changed in sequence, in accordance with further embodiments of the method.

The method 100 is described below in conjunction with FIGS. 2A, 2B, 2C, 2D, 2E, 2F, 2G, 2H, 2I, 2J, and 2K, which illustrate cross-sectional views of portions of packaged semiconductor chip(s)/device substrate(s) at various fabrication stages. The device substrate may be an intermediate device fabricated during processing and/or packaging of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
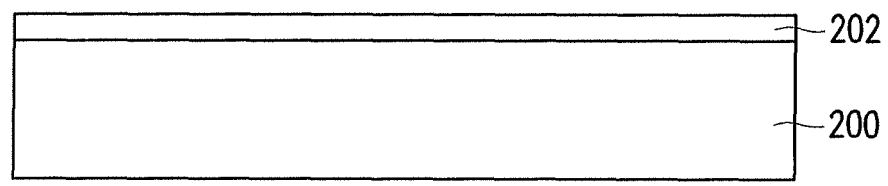
FIGS. 2A, 2B, 2C, 2D, 2E, 2F, 2G, 2H, 2I, 2J, and 2K illustrate cross-sectional views of a packaged device substrate (package) at various fabrication stages, in accordance with some embodiments of the present disclosure.

The method 100 starts at operation 102 in which a carrier substrate 200 is provided, and continues to operation 104 in which a first dielectric layer 202 is formed over the carrier substrate 200, as shown in FIG. 2A. In some embodiments, the carrier substrate 200 may be implemented in a variety of ways. For example, the carrier substrate 200 may comprise a die lead frame, a printed circuit board (PCB), a multiple chip package substrate or other types of substrates.

Referring still to FIG. 2A, in some embodiments, the first dielectric layer 202 is formed of a material that is selected from: a polymide, a polybenzoxazole (PBO), a PBO-based dielectric material, a benzocyclobutene (BCB), a BCB-based dielectric material, or a combination thereof. In some embodiments, the first dielectric layer 202 may have a thickness that is about 2~10 micrometers (μm), while any desired thickness of the first dielectric layer 202 may be used for other embodiments. The forming of the first dielectric layer 202 may be used to form one or more conductive pillars that provides direct electrical connections to vias and/or a semiconductor chip, as discussed in further detail below. The first dielectric layer 202 formed of these materials and thicknesses may help reducing warpage, reducing thermal coefficient mismatch, increasing pin numbers, etc., as discussed in further detail below.

Referring again to FIG. 1, the method 100 continues to operation 106 in which a patterned mask layer 204 (FIG. 2B) is formed over the first dielectric layer 202, in accordance with various embodiments. The patterned mask layer 204 defines openings 205 which further define the shape of subsequently formed vias, which are formed by filling the openings 205 with a conductive material, as discussed in further detail below. In the illustrated embodiment of FIG. 2B, the patterned mask layer 204 may be a patterned photoresist mask, hard mask, a combination thereof, or the like.

Figure 2B:
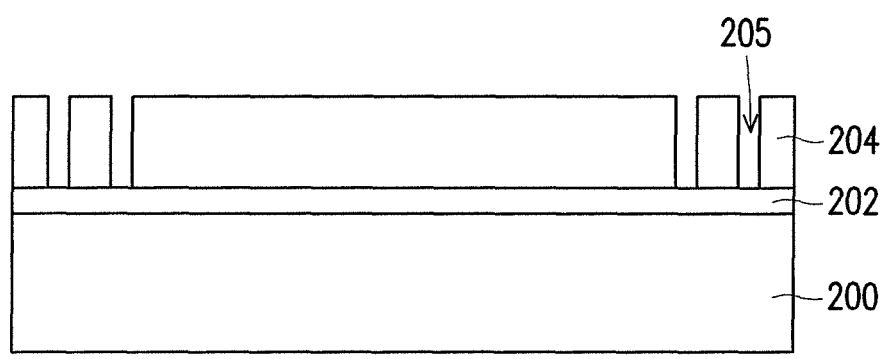
Figure 2C:
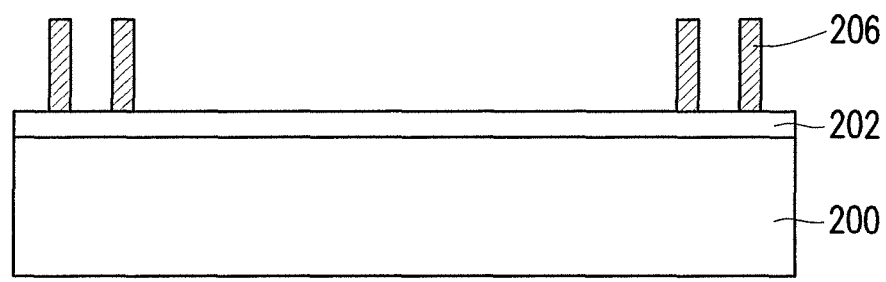

Referring now to FIG. 1 and FIG. 2C, the method 100 continues to operation 108 in which one or more vias 206 are formed over the first dielectric layer 202 by filling the openings 205 (FIG. 2B) with a conductive material and thereafter removing the patterned mask layer 204 (FIG. 2B). Any of a variety of conductive material may be used to form the via 206 such as, for example, copper (Cu), nickel (Ni), platinum (Pt), aluminum (Al), lead-free solder (e.g., SnAg, SnCu, SnAgCu), or a combination thereof. In the embodiments discussed below, the via 206 may include at least Cu. Regarding the filling of the opening, any of a variety of approaches may be used, for example, electroplating, physical vapor deposition (PVD), chemical vapor deposition (CVD), electrochemical deposition (ECD), molecular beam epitaxy (MBE), atomic layer deposition (ALD), and the like. It should be noted that in some embodiments, such as those that deposit a conformal layer over the entire surface of the patterned mask layer and the first dielectric layer (e.g., PVD and CVD), it may be desirable to perform an etching or planarization process (e.g., a chemical mechanical polishing (CMP) process) to remove excess conductive material from the surface of the patterned mask layer 204. After the filling the opening with the above-mentioned material (e.g., Cu), the patterned mask layer 204 may be subsequently removed (stripped) by, for example, a chemical solution such as a mixture of ethyl lactate, anisole, methyl butyl acetate, amyl acetate, cresol novolak resin, and diazo photoactive compound (referred to as SPR9), a mixture of a solvent (e.g., dimethyl sulfoxide (DMSO)), an alkaline (e.g., potassium hydroxide KOH or tetramethylammonium hydroxide (TMAH)), a surfactant additive, or a combination thereof.

Figure 2D:
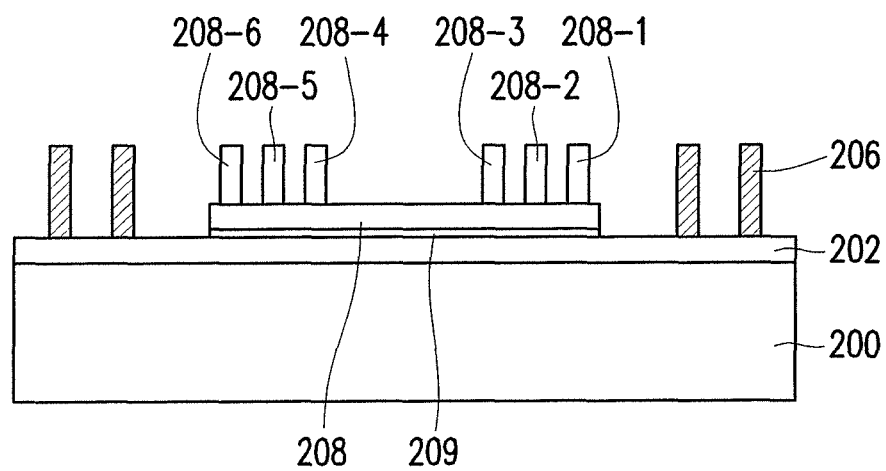

Referring now to FIG. 1 and FIG. 2D, the method 100 continues to operation 110 in which a device substrate 208 is coupled to the first dielectric layer 202 and disposed between the vias 206 in accordance with various embodiments. The device substrate 208 may comprise one or more microelectronic/nanoelectronic devices, such as transistors, electrically programmable read only memory (EPROM) cells, electrically erasable programmable read only memory (EEPROM) cells, static random access memory (SRAM) cells, dynamic random access memory (DRAM) cells and other microelectronic devices, which may be interconnected to form one or more integrated circuits. The device substrate 208 contemplates one or more conventional or future-developed microelectronic/nanoelectronic devices. The bulk of the device substrate 208 may be a silicon-on-insulator (SOI) substrate and/or may comprise silicon, gallium arsenide, strained silicon, silicon germanium, carbide, diamond and other materials.

Referring still to FIG. 2D, in some embodiments, the device substrate 208 is bonded to the first dielectric layer 202. More specifically, a backside of the device substrate 208, e.g., a side opposite of electrical contacts 208-1 to 208-6, is disposed on the first dielectric layer 202 using, for example, a die attach film (DAF) or other adhesive layers. In the illustrated embodiment of FIG. 2D, layer 209 may include such a DAF.

Figure 2E:
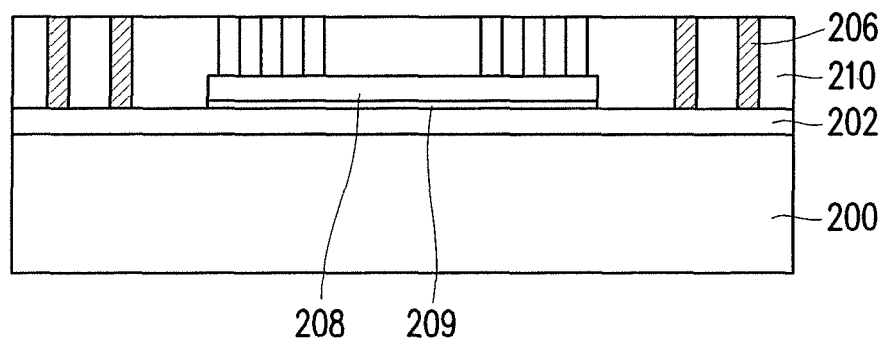

Referring now to FIG. 1 and FIG. 2E, the method 100 continues to operation 112 in which a second dielectric layer 210 is formed over the device substrate 208 in accordance with various embodiments. In some embodiments, the second dielectric layer 210 may include a molding compound. For example, the second dielectric layer 210 is formed of a material that is selected from: an epoxy molding compound (EMC) material, a molded underfill (MUF) material, an ajinomoto build-up film (ABF) material, an ABF-based material, a resin material, or a combination thereof. In some embodiments, the second dielectric layer 210 may be formed by using at least one of: PVD, CVD, ALD, ECD, MBE, or a combination thereof. In some embodiments, the second dielectric layer may have a thickness that is about 100~300 micrometers (μm) while any desired thickness of the second dielectric layer may be used in other embodiments. The thickness of the second dielectric layer generally depends on a height of the device substrate. More particularly, the thickness of the second dielectric layer is chosen to be thicker than the height of the device substrate. In some embodiments, it may be desirable to perform an etching or planarization process (e.g., a chemical mechanical polishing (CMP) process) to remove excess material, as described above, from a top surface of the electrical contacts 208-1 of the device substrate 208 and/or a top surface of the vias 206 so as to expose the top surface(s).

Figure 2F:
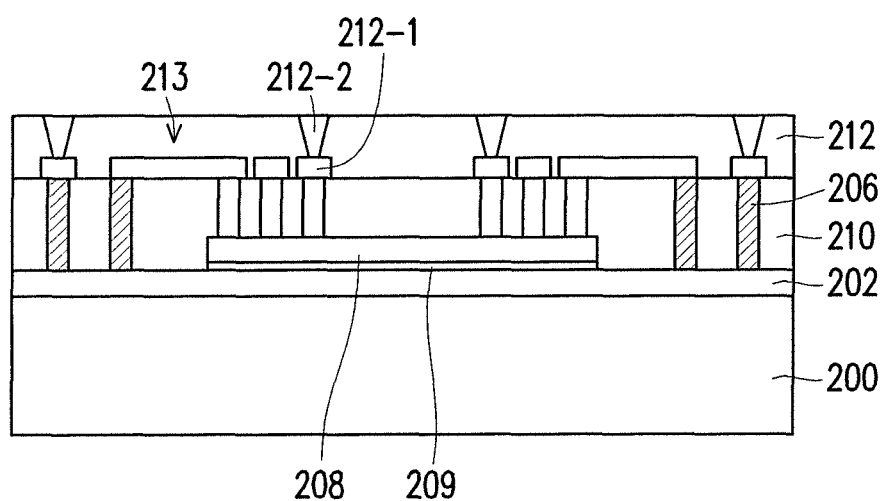

Referring now to FIG. 1 and FIG. 2F, the method 100 continues to operation 114 in which a redistribution line (RDL) layer 212 is formed over the second dielectric layer 210 in accordance with various embodiments. The RDL layer 212 is formed to provide electrical connections to and/or between the vias 206 and the device substrate 208 in accordance with an embodiment. As illustrated in FIG. 2F, one or more conductive lines (e.g., 212-1) may be formed within the RDL layer 212 to provide electrical connections to and/or between the vias 206 and the device substrate 208. In some embodiments, the RDL layer 212 may include via 212-2 that is formed of a conductive material (e.g., Cu) to provide an electrical connection to and/or between the conductive line 212-1 and a solder contact, which will be discussed in FIG. 2G.

Referring still to FIG. 2F, the RDL layer 212 may comprise a layer of a dielectric layer 213 (e.g., a passivation layer) having a conductive layer (e.g., the conductive line 212-1, the via 212-2, etc.) formed therein. The dielectric layer 213 may comprise, for example, a polymer material, such as epoxy, polyimide, polybenzoxazole (PBO), and the like, or may be formed of commonly known dielectric materials, such as spin-on glass, silicon oxide, silicon oxynitride, or the like, formed by any suitable method such as spin coating. In some embodiments, the RDL layer 212 may be formed by at least one of the following processes: the conductive lines 212-1 are first disposed over the second dielectric layer 210 to provide desirable connections to and/or between the vias 206, as illustrated in FIG. 2F; the dielectric layer 212 is then disposed over the conductive lines 212-1 and the second dielectric layer 210; the vias 212-2 are subsequently formed within the dielectric layer 213 to form the RDL layer 212. After the forming of the RDL layer 212 (operation 114), an etching or planarization process (e.g., a chemical mechanical polishing (CMP) process) may be performed to remove excessive RDL layer 212 so as to expose a top surface of the via 212-2.

Figure 2G:
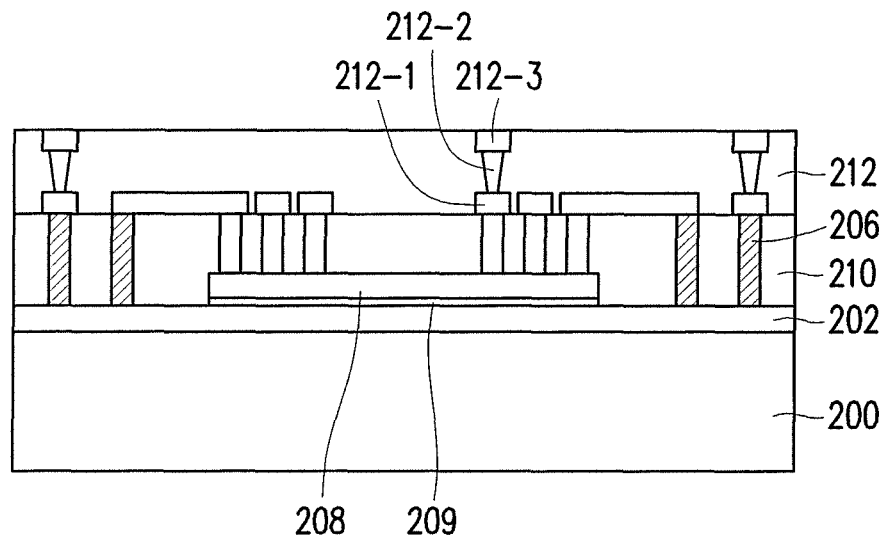

In some alternative embodiments, in addition to the conductive line 212-1 and the via 212-2, the RDL layer 212 may further include one or more conductive lines 212-3 disposed above the via 212-2, as shown in an illustrated embodiment of FIG. 2G. Following the process steps described above to form the RDL layer 212, the conductive lines 212-3 may be formed after the vias 212-2 are formed. For example, after the vias 212-2 are formed within the dielectric layer 213, the conductive lines 212-3 are each disposed over the dielectric layer 213 to align with a respective via 212-2.

Figure 2H:
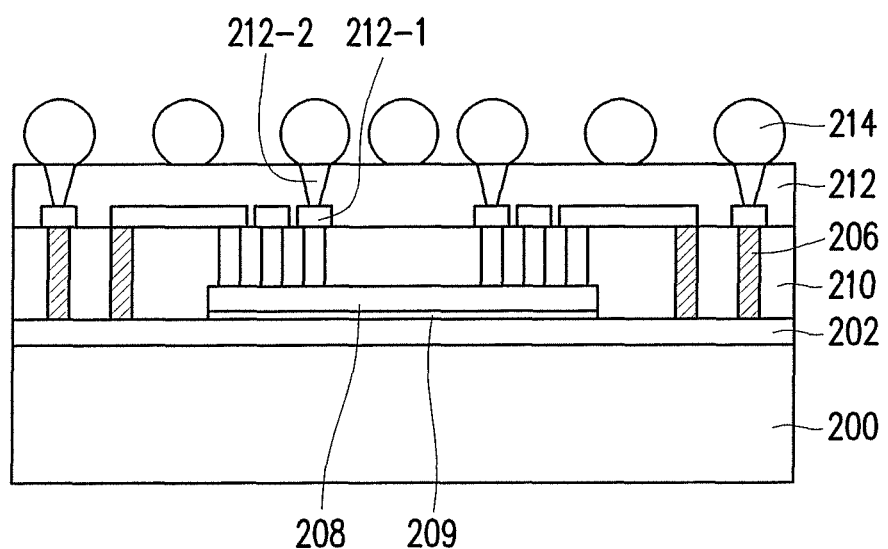

Referring now to FIG. 1 and FIG. 2H, the method 100 continues to operation 116 in which one or more solder contacts 214 are formed on a top surface of the RDL layer 212 in accordance with various embodiments. The solder contacts 214 can be formed using any known technique to provide an electrical connection to and/or between the RDL layer 212 and another carrier substrate or layer, as discussed in further detail below with reference to FIG. 2I. Although in the illustrated embodiment of FIG. 2H, the solder contact 214 is in a sphere-based shape (e.g., a solder ball), the solder contact 214 may be formed in a variety of shapes suitable for providing an electrical contact between two structures or points of contact. In some embodiments, the solder contact 214 may be formed of gold (Au), silver (Ag), nickel (Ni), tungsten (W), aluminum (Al), and/or alloys thereof.

Figure 2I:
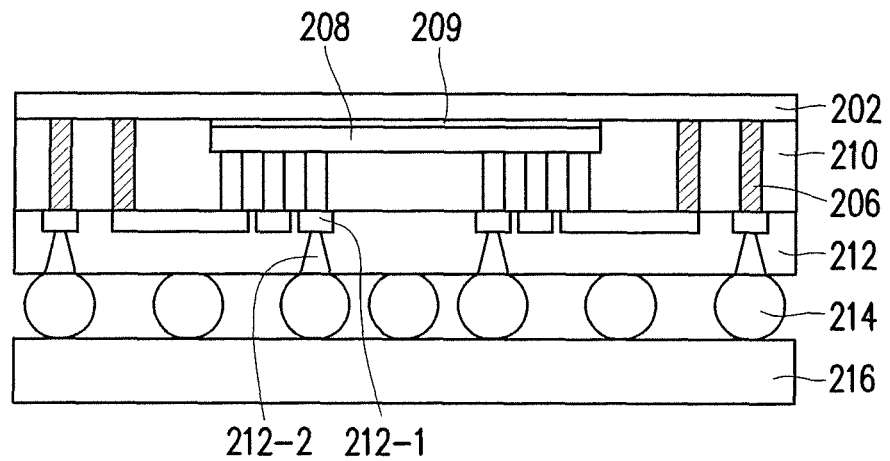

Referring now to FIG. 1 and FIG. 2I, the method 100 continues to operation 118 in which the first carrier substrate 200 is removed and decoupled from the first dielectric layer 202, and a second carrier substrate 216 is coupled to the solder contacts 214, in accordance with various embodiments. Similar to the first carrier substrate 200, the second carrier substrate 216 may comprise a die lead frame, a printed circuit board (PCB), a multiple chip package substrate or other types of substrates.

Figure 2J:
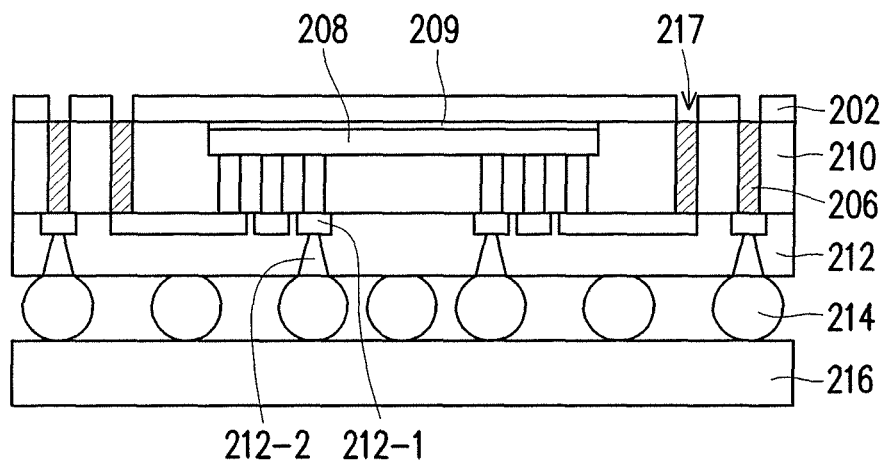

Referring now to FIG. 1 and FIG. 2J, the method 100 continues to operation 120 in which one or more openings 217 are formed in the first dielectric layer 202 in accordance with various embodiments. As illustrated in FIG. 2I, the openings 217 are aligned with the vias 206. The formation of the openings 217 may include one or more processes such as: forming a patterned mask layer over the first dielectric layer 202 in which the patterned mask layer may include one or more openings that are aligned with the opening(s) 217, etching the first dielectric layer 202 using the patterned mask layer, removing the patterned mask layer, and thereafter performing a cleaning process.

Figure 2K:
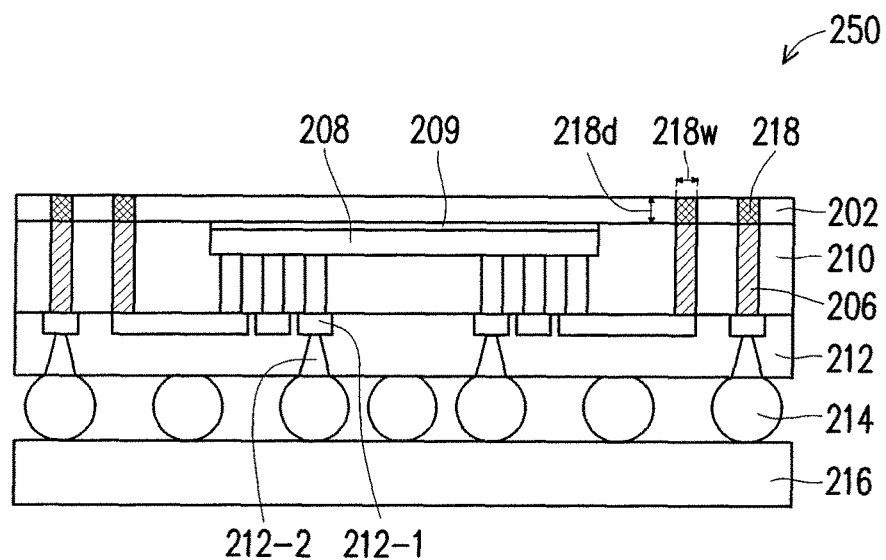

Referring now to FIG. 1 and FIG. 2K, the method 100 continues to operation 122 in which the openings 217 are filled with a conductive material in accordance with various embodiments. The filling of the conductive material is to form one or more conductive pillars 218 in the first dielectric layer 202. Although, in some embodiments, the conductive material used to fill the opening 217 is Cu, any of a variety of conductive material may be used while remaining within the scope of the present disclosure. Upon the filling of Cu into the openings 217, one or more Cu pillars 218 are formed, and accordingly, the method 100 continues to operation 124 in which a package 250 is formed, as illustrated in FIG. 2K.

Referring still to FIG. 2K, the Cu pillar 218 is formed within (i.e., embedded in) the package 250. In some embodiments, the Cu pillar serves as an electrical contact to directly couple the package 250 to additional package(s)/device substrate(s)/carrier substrate(s), hereinafter "fan-out (FO) structures." Using the disclosed method 100 to form the package 250 having Cu pillars 218 embedded therein provides a variety of advantages over the packages formed by conventional packaging approaches (e.g., Package-on-Package (PoP), ball grid array (BGA), etc.) such as, for example, increasing a number of pins (i.e., electrical contacts) of the package, reducing alternative current (AC) impedance, etc., as discussed in further detail below.

In some embodiments, the Cu pillar is formed through filling the opening 217 by any of a variety of approaches such as, for example, electroplating, physical vapor deposition (PVD), chemical vapor deposition (CVD), electrochemical deposition (ECD), molecular beam epitaxy (MBE), atomic layer deposition (ALD), and the like. It should be noted that in some embodiments, such as those that deposit a conformal layer over the entire surface of the first dielectric layer 202 (e.g., PVD and CVD), it may be desirable to perform an etching or planarization process (e.g., a chemical mechanical polishing (CMP) process) to remove excess conductive material (i.e., Cu in the current embodiment) from the surface of the first dielectric layer 202.

In some embodiments, the Cu pillar 218 is formed through filling Cu into the opening 217 of the first dielectric layer 202 that has a depth 218$d$ of about 2~10 μm (i.e., the thickness of the first dielectric layer 202) and a width 218$w$ of about 20~200 μm. The width 218$w$ of the opening 217 may depend on a variety of design parameters such as, for example, a pitch size of the device substrate 208, a layout between the device substrate 208 and its interconnection(s), etc. Since the size (e.g., width 218w) of the opening may be precisely defined by one or more (photo) lithography methods, a finer size of an electrical contact (i.e., the Cu pillar 218) can be realized, which in turn increases the number of possible electrical contacts that can be provided on an integrated circuit chip having limited real estate. Additionally, in some embodiments, since the via 206 configured to electrically connect the device substrate 208 is formed of Cu, using the Cu pillar 218 as an electrical contact to stack (electrically couple) additional fan-out structures that may be formed can reduce the AC impedance of the electrical contact and/or an electrical connection path that includes such an electrical contact.

Figure 2L:
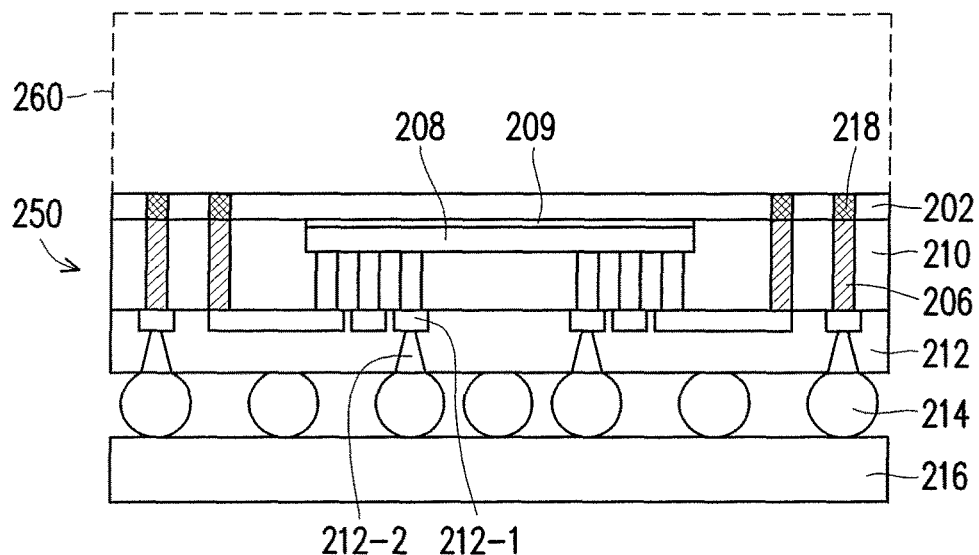
FIG. 2L illustrate a cross-sectional view of a packaged device substrate (package) to which a fan out structure is stacked, in accordance with some embodiments of the present disclosure.

As described above, the disclosed flow chart (from operations 102 to 124) provides a method to form the package 250 having one or more embedded Cu pillars 218 that enables additional FO structures to be stacked (electrically coupled) to the package 250 with the above-mentioned advantages. Referring to FIG. 1 and FIG. 2L, the method 100 continues to operation 126 in which one or more FO structures 260 are stacked onto and electrically coupled to the package 250 through the Cu pillars 218, in accordance with various embodiments. In some embodiments, the FO structure 260 may be substantially similar to the package 250 and may be formed using, at least in part, the disclosed method 100. Various embodiments of the FO structures 260 will be discussed below with reference to FIGS. 3, 4, and 5, respectively. In some embodiments, each of the various FO structures 206 may be coupled to the package 250 through a hybrid-bonding technique. Such a hybrid-bonding technique will be discussed in further detail below with respect to FIGS. 6A and 6B.

Figure 3:
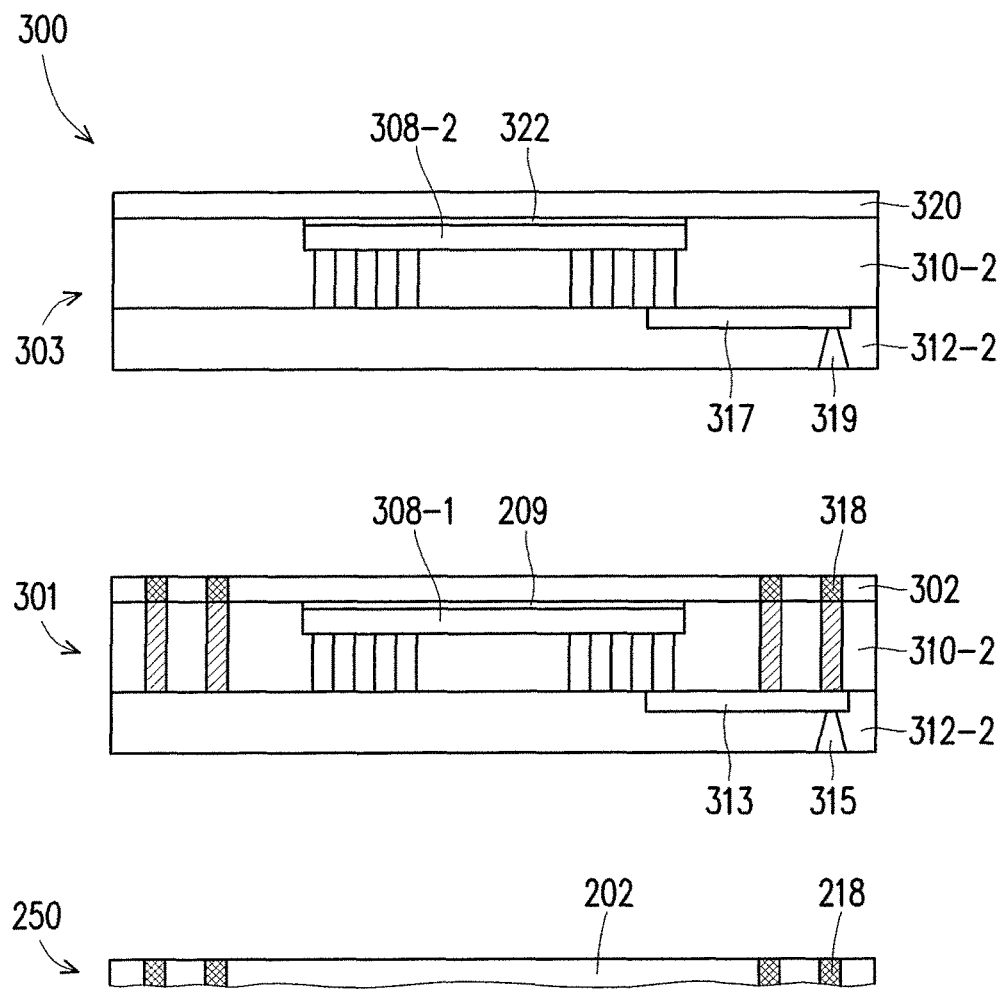
FIG. 3 illustrates a cross-sectional view of an exemplary fan out structure of FIG. 2K, in accordance with some embodiments of the present disclosure.

FIG. 3 illustrates an exemplary embodiment of a FO structure 300 that can be coupled to the package 250 (FIG. 2J), in accordance with various embodiments. In the illustrated embodiment of FIG. 3, the FO structure 300 includes two sub FO structures 301 and 303. These two sub FO structures are substantially similar to the package 250 except that the sub FO structures 301 and 303 do not include a solder contact (e.g., 214) and an attached carrier substrate (e.g., 216). Also, the sub FO structure 303 includes a lid layer 320. For brevity, the components of the sub FO structures 301 and 303 that are similar to the package 250 will be omitted. For example, the sub FO structures 301 includes a first dielectric layer 302 with embedded Cu pillar 318 formed therein, a second dielectric layer 310-1 with a device substrate 308-1 and via(s) 306-1 formed therein, and an RDL layer 312-1 with conductive line(s) 313 and via(s) 315 formed therein; the sub FO structures 303 includes a dielectric layer 310-2 (similar to the second dielectric layers 210 and 310-1) with a device substrate 308-2 formed therein, and an RDL layer 312-2 with conductive line(s) 317 and via(s) 319 formed therein. In some embodiments, if there is no additional FO structure to be coupled to a top FO structure (e.g., sub FO structure 303), such a top FO structure need not include a via formed within its "dielectric layer" such as the layer 310-2. But the top FO structure may include a lid layer 320 formed along a bottom surface of the device substrate and the dielectric layer with an adhesive layer therebetween. For example, in FIG. 3, the sub FO structure 303 is a top FO structure. As illustrated in FIG. 3, the sub FO structure 303 includes a lid layer 320 and an adhesive layer 322 formed between the device substrate 308-2 and the lid layer 320. In some embodiments, the lid layer 320 may be formed of a metal plate (e.g., Cu plate), and the adhesive layer 322 may include a die attach film (DAF), a seed layer, a solder layer, and/or any other suitable resin materials. In some embodiments, the seed layer may be formed of materials such as titanium (Ti), nickel (Ni), or the like; and the solder layer may be formed of materials such as tin (Sn), silver (Ag), copper (Cu), or the like.

Referring still to FIG. 3, the sub FO structures 301 and 303 may be formed by using at least part of the method 100 with one or more alternative operations. More specifically, the package 250, and the sub FO structures 301 and 303 may be formed in parallel (i.e., simultaneously) so that the whole packing process to stack (electrically couple) the FO structure 300 to the package 250 may be expedited. For example, referring back to FIG. 1, while the package 250 is formed by using the method 100, the sub FO structure 301 is simultaneously formed by using the operations from 102 to 122 but omitting the operation 116 (i.e., coupling the solder contacts 214) and part of the operation 118 (i.e., omitting the "coupling to a second carrier substrate" in operation 118). And the sub FO structure 303 is also simultaneously formed by using the following steps: the operation 110 in which the device substrate 308-2 is coupled to the lid layer 320 by means of the adhesive layer 322 (i.e., instead of being coupled to a first dielectric layer (e.g., 202)); an optional step in which a thermal interface material (TIM) layer (e.g., a thermal glue layer, a thermal grease layer, etc.) is formed over a top surface of the device substrate 308-2 for an optimized thermal coupling effect; the operation 112 (i.e., forming the dielectric layer 310-2); and the operation 114 (i.e., forming the RDL layer 312-2). Alternatively or additionally, in some embodiments, after the operation 114, one or more BGA balls may be formed over a top surface of the RDL layer 312-2 and each aligned with a respective via 319 so that the BGA balls may each serve as an electrical contact.

A package/FO structure that has an embedded Cu pillar (formed by the method 100) may provide an electrical contact (i.e., the Cu pillar) to which another FO structure is to be coupled, which may, accordingly, provide various advantages, as described above. In the illustrated embodiment of FIG. 3, the sub FO structure 301 can be directly (electrically) coupled to the package 250 by coupling the via 315 to the package 250's embedded Cu pillar(s) 218, and similarly, the top FO structure 303 can be electrically coupled to the sub FO structure 301 by coupling the via 319 to the sub FO structure 301's embedded Cu pillar(s) 318. In some alternative embodiments, other than the Cu pillar(s) 318, any of a variety of electrical contacts may be used to couple the sub FO structure 301 to another FO structure. For example, the variety of electrical contacts include a solder pillar made of copper (Cu), tin (Sn), silver (Ag), bismuth (Bi), or a combination thereof, a BGA ball (e.g., 214), etc. In some embodiments, the variety of electrical contacts may be formed on and/or within the first dielectric layer 302 by using a laser-drilling method, a dry etching method, a solder plating method, a micro-ball mounting method, or the like.

Figure 4:
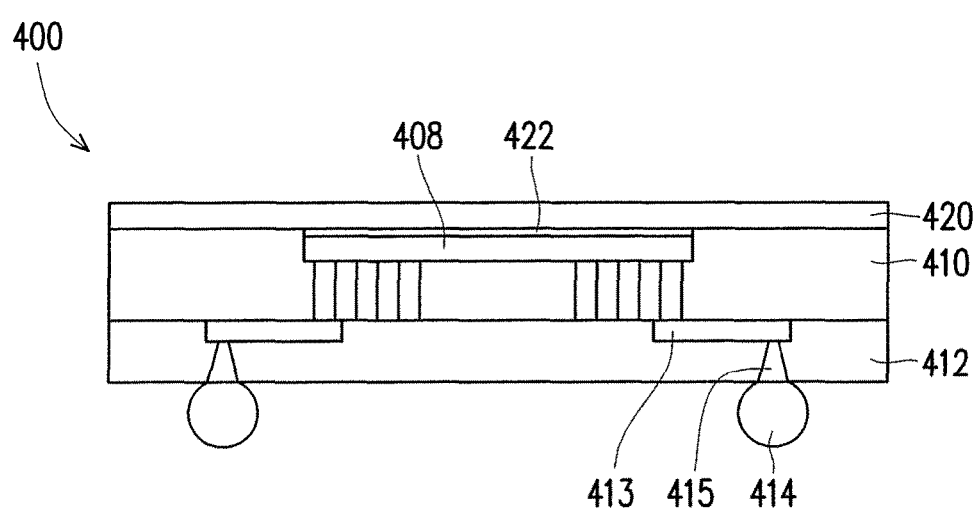
FIG. 4 illustrates a cross-sectional view of another exemplary fan out structure of FIG. 2K, in accordance with some embodiments of the present disclosure.

FIG. 4 illustrates another exemplary embodiment of a FO structure 400 to be coupled to the package 250 (FIG. 2J), in accordance with various embodiments. The FO structure 400 is substantially similar to the sub FO structure 303 except that, in some embodiments, the FO structure 400 may further include a solder contact 414 coupled to via 415. More specifically, similar to the sub FO structure 303, the FO structure 400 includes a dielectric layer 410 (similar to the dielectric layer 310-2 of FIG. 3) with a device substrate 408 formed therein, an RDL layer 412 with conductive line(s) 413 and via(s) 415 formed therein, a lid layer 420, and an adhesive layer 422. The solder contact 414 may be substantially similar to the solder contact 214 (FIGS. 2G-2K). In the illustrated embodiment of FIG. 4, the solder contact 414 is aligned with the via 415 formed within the RDL layer 412, and more specifically, the solder contact 414 is formed to couple the FO structure 400 to the Cu pillar(s) 218 (FIG. 2J) of the package 250. That is, when the FO structure 400 is coupled to the package 250, the solder contact 414 and the Cu pillar 218 may be connected to each other so as to provide an electrical conduction path.

Figure 5:
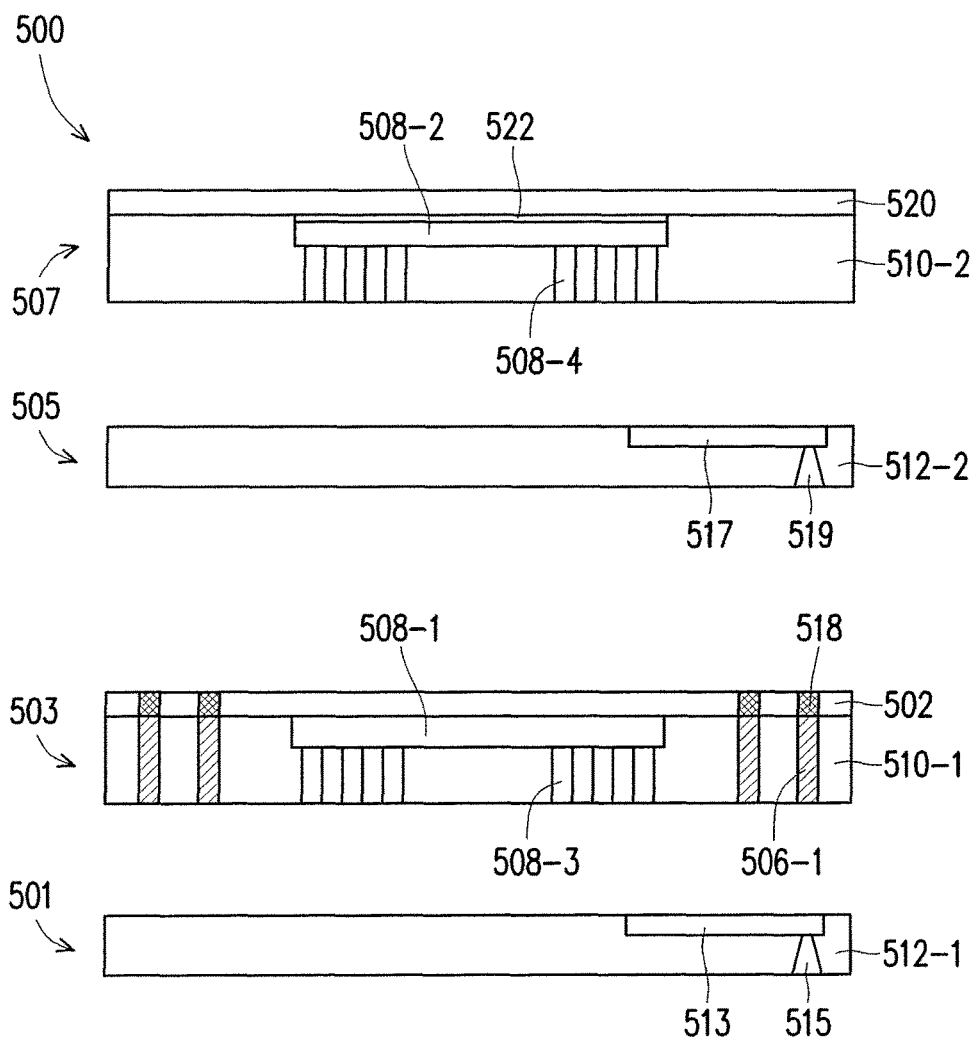
FIG. 5 illustrates a cross-sectional view of yet another exemplary fan out structure of FIG. 2K, in accordance with some embodiments of the present disclosure.

FIG. 5 illustrates yet another exemplary embodiment of a FO structure 500 to be coupled to the package 250 (FIG. 2J), in accordance with various embodiments. The FO structure 500 includes four sub FO structures 501, 503, 505, and 507. The sub FO structures 501 and 503, in combination, are substantially similar to the sub FO structure 301 of FIG. 3. The sub FO structures 505 and 507, in combination, are substantially similar to the sub FO structure 303 of FIG. 3. More specifically, the sub FO structures 501 includes an RDL layer 512-1 with conductive line(s) 513 and via(s) 515 formed therein. The sub FO structures 503 includes a first dielectric layer 502 with embedded Cu pillar 518 formed therein, and a second dielectric layer 510-1 with a device substrate 508-1 and via(s) 506-1 formed therein. The sub FO structures 505 includes an RDL layer 512-2 with conductive line(s) 517 and via(s) 519 formed therein. The sub FO structures 507 includes a dielectric layer 510-2 (similar to 310-2) with a device substrate 508-2 formed therein, a lid layer 520, and an adhesive layer 522, with a lid layer 520 formed on top of the adhesive layer 522 and second dielectric layer 510-2. Different from the embodiment of FIG. 3, in some embodiments, these four sub FO structures 501, 503, 505, and 507 may be formed by using a respective combination of operations, as described above with reference to FIG. 3. As such, these four sub FO structures 501, 503, 505, and 507 may be simultaneously formed, and, accordingly, stacking the FO structure 500 to the package 250 may be further expedited. In some embodiments, the sub FO structure 507 may be electrically coupled to the sub FO structure 505 by coupling electrical contact(s) 508-4 of the device substrate 508-2 to the conductive line 517, the sub FO structure 505 may be electrically coupled to the sub FO structure 503 by coupling the via 519 to the Cu pillar 518 of the sub FO structure 503, the sub FO structure 503 may be electrically coupled to the sub FO structure 501 by coupling the via 506-1 and/or electrical contact(s) 508-3 of the device substrate 508-1 to the conductive line 513. As such, the sub FO structures 501, 503, 505, and 507 are electrically coupled to one another.

Based on the above discussions, it can be seen that the present disclosure offers various advantages. It is understood, however, that not all advantages are necessarily discussed herein, and other embodiments may offer different advantages, and that no particular advantage is required for all embodiments.

Figure 6A:
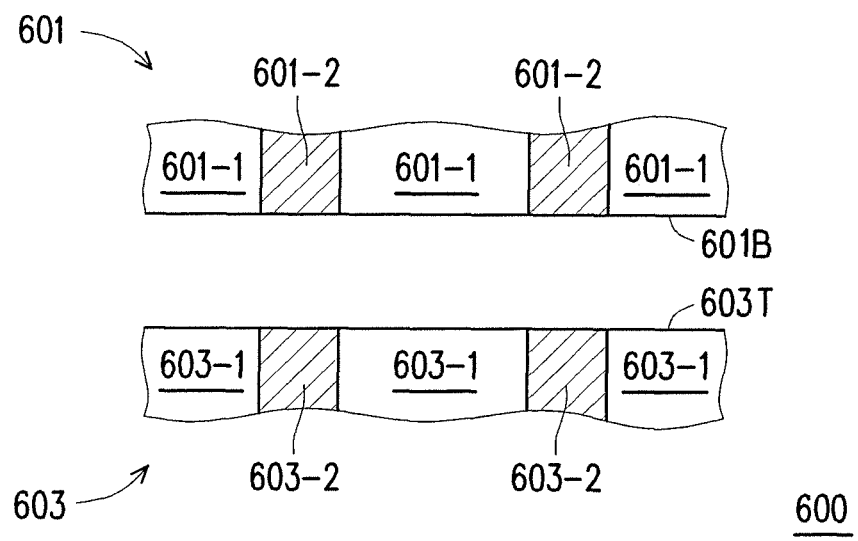
FIG. 6A illustrates a cross-sectional view of two structures to be coupled with each other via a hybrid-bonding technique, in accordance with some embodiments of the present disclosure.

FIG. 6A illustrates a cross-sectional view of two exemplary structures to be coupled (i.e., bonded) using the above-mentioned hybrid-bonding technique, in accordance with various embodiments. As shown, first structure 601 includes a bottom surface 601B and second structure 603 includes a top surface 603T. Moreover, the first structure 601 includes a first portion 601-1 that is formed of one or more dielectric materials (e.g., the materials used to form the first and second dielectric layers 202 and 210) and a second portion 601-2 that is formed of one or more conductive materials (e.g., Cu). Similarly, the second structure 603 includes a first portion 603-1 that is formed of one or more dielectric materials (e.g., the materials used to form the first and second dielectric layers 202 and 210) and a second portion 603-2 that is formed of one or more conductive materials (e.g., Cu). The term "hybrid-bonding technique," used herein, means that when two surfaces/structures are to be bonded to each other, each to-be bonded surface includes at least first and second materials that are different from each other. And when bonded, the respective first materials of the two surfaces/structures are bonded to each other, and respective second materials of the two surfaces/structures are bonded to each other.

In some embodiments, referring again to FIG. 3, the sub FO structure 301 may be bonded to the package 250 and the sub FO structure 303 may be bonded to the sub FO structure 301 using the hybrid-bonding technique, respectively. More specifically, when the sub FO structure 301 is bonded to the package 250, the via 315 is bonded to the Cu pillar 218 and the dielectric layer 312-2 of the sub FO structure 301 and the dielectric layer 202 of the package 250 are bonded with each other; when the sub FO structure 303 is bonded to the sub FO structure 301, the via 319 is bonded to the Cu pillar 318, and the dielectric layer 312-2 of the sub FO structure 303 and the first dielectric layer 302 of the sub FO structure 301 are bonded with each other.

Figure 6B:
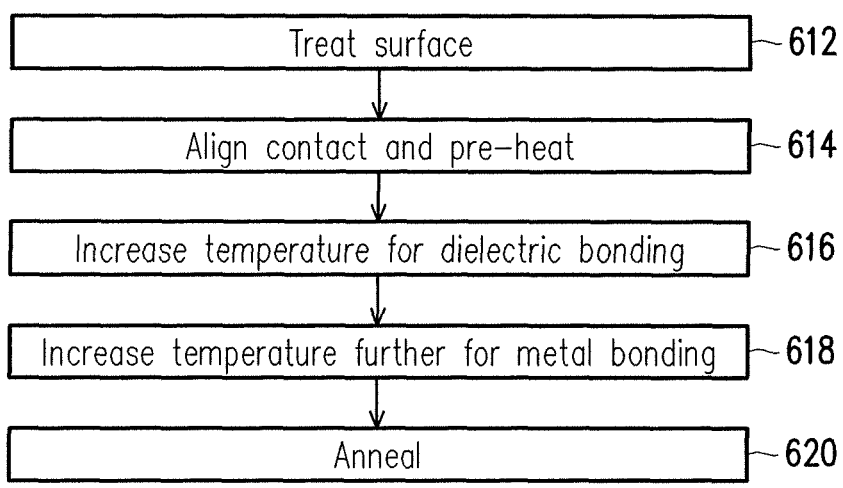
FIG. 6B illustrates an exemplary flow chart of a method to hybrid-bond two structures, in accordance with some embodiments of the present disclosure.

FIG. 6B illustrates an exemplary flow chart of a method 610 to perform the hybrid-bonding technique, in accordance with various embodiments. Since the method 610 can be performed on any two structures/surface each including two different materials, for the sake of brevity, the following discussion of the method 610 will be provided in conjunction with the exemplary structures 601 and 603 of FIG. 6A. In some embodiments, the method 610 starts at operation 612 in which the two surfaces 601B and 603T are treated by one or more cleaning processes (e.g., an RCA clean process) and/or one or more plasma processes. The method 610 proceeds to operation 612 in which the two structures 601 and 603 are aligned such that the conductive materials (e.g., 601-2 and 603-2) of the structures 601 and 603 are aligned to each other, respectively, which causes the dielectric materials (e.g., 601-1 and 603-1) of the structures 601 and 603 are aligned to each other as well. Moreover, in some embodiments, during the operation 614, both of the structures 601 and 603 are placed in a chamber that is pre-heated to a first elevated temperature, e.g., about 100° C., so as to activate the surfaces 601B and 603T. The method 610 then continues to operation 616 in which the chamber is heated to a second elevated temperature, e.g., about 150° C., while the surfaces 601B and 603T are placed substantially close to each other. As such, the surfaces 601B and 603T may be in contact and the dielectric materials 601-1 and 603-1 may be bonded to each other. The method 610 then continues to operation 618 in which the chamber is heated to a third elevated temperature, e.g., about 200~250° C., so as to cause the conductive materials 601-2 and 603-2 to be bonded to each other. The method 610 continues to operation 620 in which the chamber is cooled down for an annealing purpose.

Figure 7A:
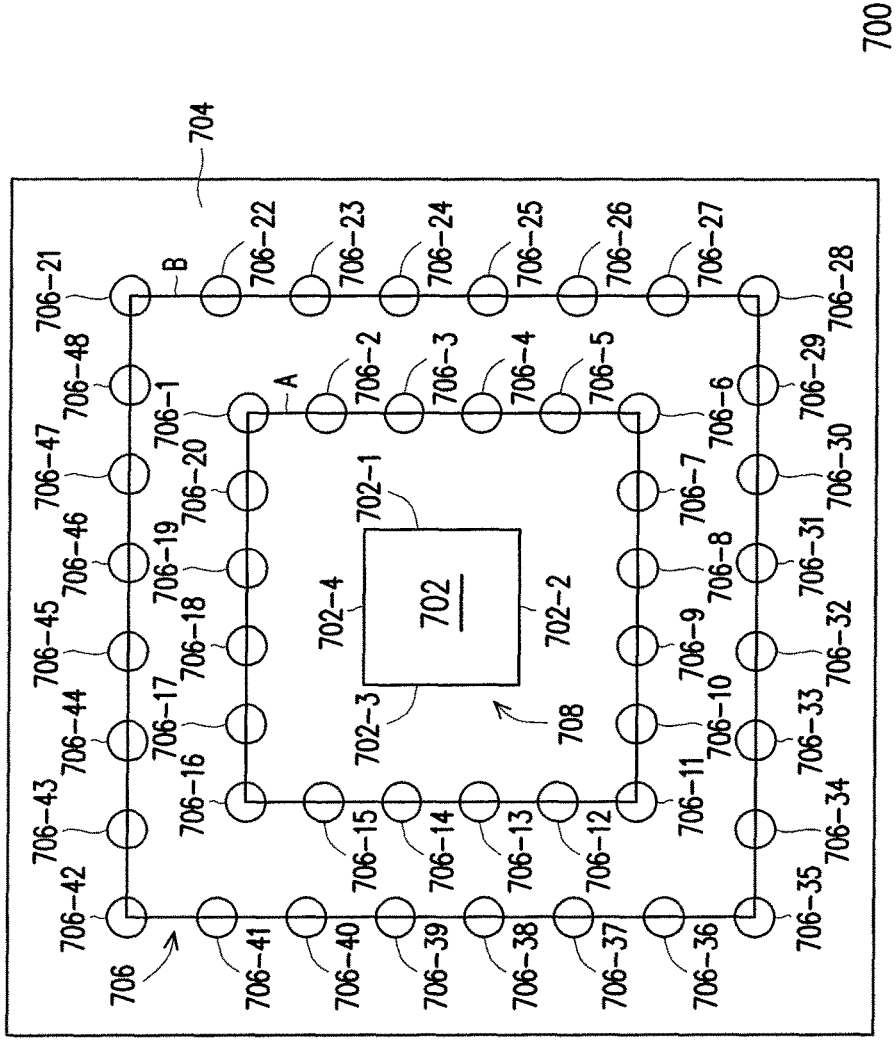
FIGS. 7A and 7B illustrate top views of exemplary layouts of two lid layers, respectively, in accordance with some embodiments of the present disclosure.
Figure 7B:
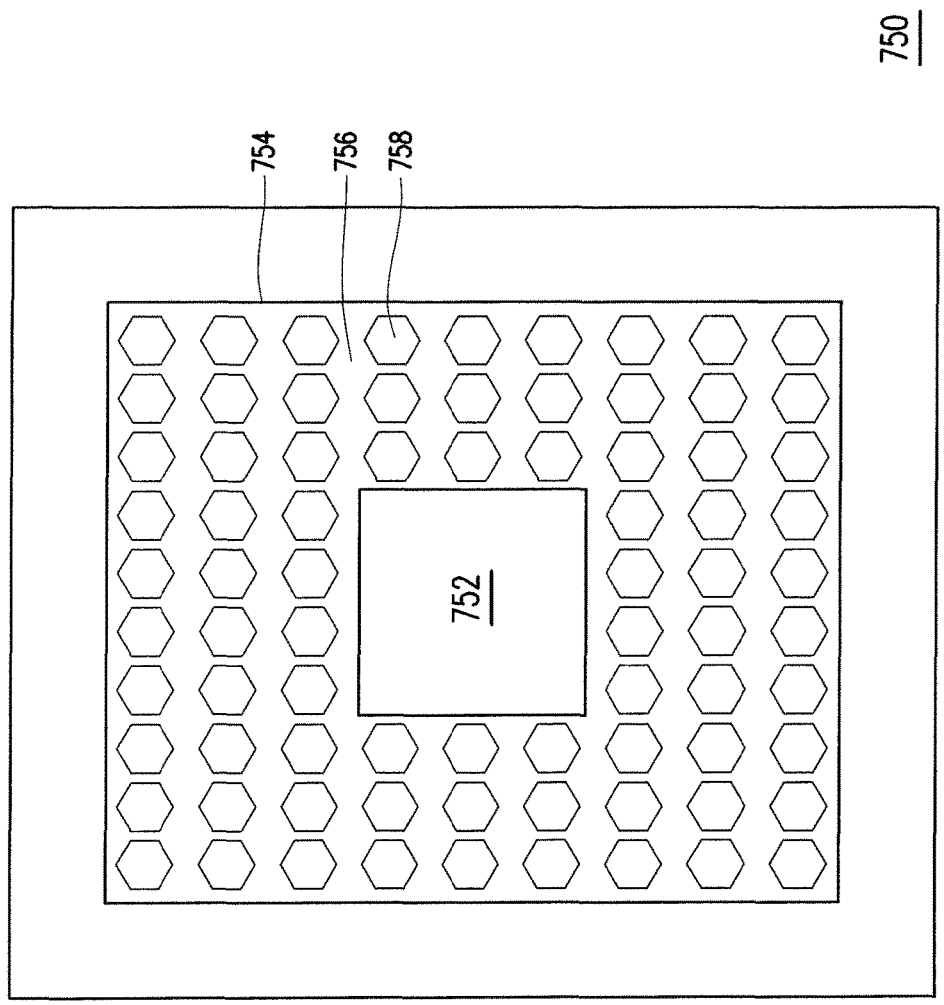

In some embodiments, the above-described lid layer, e.g., 320 of FIG. 3, 420 of FIG. 4, 520 of FIG. 5, etc., may be formed in any of a variety of shapes/configurations. FIGS. 7A and 7B illustrate top views of exemplary layouts of two lid layers, respectively. The two top views of layouts in FIGS. 7A and 7B are each shown in an upside-down fashion. As shown in FIG. 7A, a sub FO structure 700 (or a top FO structure) includes a device substrate 702 and a lid layer 704. In some embodiments, the lid layer 704 is attached to a bottom surface (a surface facing into the plane) of the device substrate 702. More specifically, the lid layer 704 further includes a plurality of pillars 706 surrounding the device substrate 702 and extending/protruding out of the plane. In some embodiments, the pillars 706 are each formed of a substantially similar metal material to the lid layer 704 such as, for example, Cu.

In some embodiments, the plurality of pillars 706 are arranged in one or more contours that each surrounds the device substrate 702, and such a contour includes a lumen (e.g., 708) for physically disposing the device substrate 702 therein. In the exemplary layout of FIG. 7A, the device substrate 702 has a square shape. As such, the plurality of pillars 706 may be accordingly laid out as a square-shaped contour. It is noted that the device substrate 702 may have any of a variety of shapes (e.g., a rectangle, a circle, a triangle, etc.), which may accordingly cause the plurality of pillars 706 to be arranged in one or more contours each with a corresponding shape to surround the device substrate 702.

More specifically, in the example in which the pillars 706 are laid out as one or more square-shaped contours (A and B of FIG. 7A), the contour "A" is formed of a first subset of pillars (706-1, 706-2, 706-3, 706-4, 706-5, 706-6, 706-7, 706-8, 706-9, 706-10, 706-11, 706-12, 706-13, 706-14, 706-15, 706-16, 706-17, 706-18, 706-19, 706-20, etc.), and the contour "B" is formed of a second subset of pillars (706-21, 706-22, 706-23, 706-24, 706-25, 706-26, 706-27, 706-28, 706-29, 706-30, 706-31, 706-32, 706-33, 706-34, 706-35, 706-36, 706-37, 706-38, 706-39, 706-40, 706-41, 706-42, 706-43, 706-44, 706-45, 706-46, 706-47, 706-48, etc.). The first subset of pillars (i.e., the contour A) may be further divided into four groups, wherein each group is configured to be aligned along a side of the device substrate 702. For example, a first group of the pillars (e.g., 706-1, 706-2, 706-3, 706-4, 706-5, and 706-6) is aligned with side 702-1 of the device substrate 702; a second group of the pillars (e.g., 706-7, 706-8, 706-9, and 706-10) is aligned with side 702-2 of the device substrate 702; a third group of the pillars (e.g., 706-11, 706-12, 706-13, 706-14, 706-15, and 706-16) is aligned with side 702-3 of the device substrate 702; a fourth group of the pillars (e.g., 706-1, 706-18, 706-19, and 706-20) is aligned with side 702-4 of the device substrate 702. In some embodiments, the second subset of pillars (i.e., the contour B) may be further divided into four groups, wherein each group is configured to be aligned along a side of the device substrate 702. Since the layout of the contour B is substantially similar to the contour A, for clarity, the discussion of the contour B is omitted.

FIG. 7B illustrates part of a sub FO structure 750 that includes a device substrate 752 and a lid layer 754 attached to a bottom surface of the device substrate 752. In the illustrated embodiment of FIG. 7B, the lid layer 754 includes a plurality of protruded structures 756 formed in a honeycomb configuration. More specifically, the plurality of protruded structures 756 are formed as sidewalls of a plurality of hexagonal cells (e.g., 758). Each of the plurality of hexagonal cells has a three-dimensional hallow space with a cross-section in a hexagonal shape such that the plurality of protruded structures 756 form a honeycomb grid. In some embodiments, such a honeycomb grid may include a lumen (e.g., 758) for physically disposing the device substrate 752 therein.

It is noted that the contoured pillar structure of FIG. 7A and the honeycomb structure of FIG. 7B are merely examples to illustrate some embodiments of additional structures that a lid layer of a FO structure may include. In some other embodiments, a lid layer may include any of a variety of additional structures surrounding a device substrate while remaining within the scope of the present disclosure.

Figure 8:
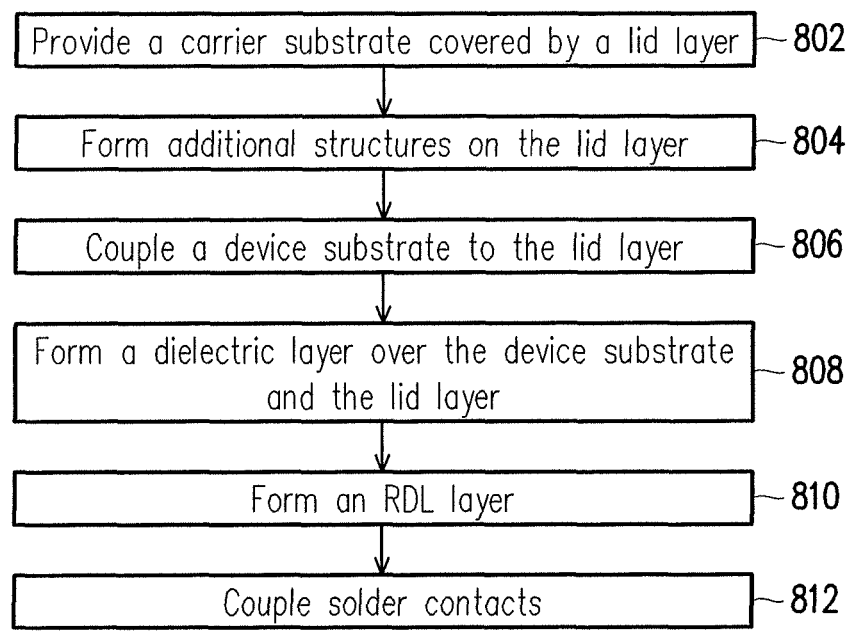
FIG. 8 illustrates an exemplary flow chart of a method to form a sub fan-out (FO) structure that includes the lid layer of FIG. 7A or 7B, in accordance with some embodiments of the present disclosure.

Referring now to FIG. 8, an exemplary flow chart of a method 800 to fabricate a FO structure 900 including a lid layer with the above-described structure(s) (e.g., the contoured pillar structure of FIG. 7A, the honeycomb structure of FIG. 7B, etc.) is provided, in accordance with various embodiments of the present disclosure. The method 800 is described below in conjunction with FIGS. 9A, 9B, 9C, 9D, 9E, and 9F, which illustrate cross-sectional views of portions of the FO structure 900 at various fabrication stages.

Figure 9A:
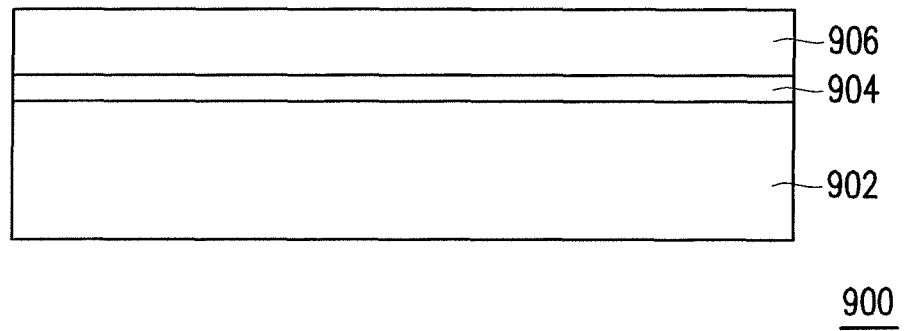
FIGS. 9A, 9B, 9C, 9D, 9E, and 9F illustrate cross-sectional views of the sub FO structure fabricated by the method of FIG. 8 at various fabrication stages, in accordance with some embodiments of the present disclosure.

The method 800 starts at operation 802 in which a carrier substrate 902 is provided. More specifically, the carrier substrate 902 is covered, at least in part, by a lid layer 906 with a first dielectric layer 904 formed therebetween, as shown in FIG. 9A. In some embodiments, the first dielectric layer 904 is first formed over the carrier substrate 902, and then the lid layer 906 is formed over the first dielectric layer 904 so as to cover the carrier substrate 900. In some embodiments, the carrier substrate 902 may be implemented in a variety of ways. For example, the carrier substrate 902 may comprise a die lead frame, a printed circuit board (PCB), a multiple chip package substrate or other types of substrates.

In some embodiments, the first dielectric layer 904 is formed of a material that is selected from: a polymide, a polybenzoxazole (PBO), a PBO-based dielectric material, a benzocyclobutene (BCB), a BCB-based dielectric material, or a combination thereof. In some embodiments, the first dielectric layer 904 may be formed by using at least one of: PVD, CVD, ALD, ECD, MBE, or a combination thereof. In some embodiments, the lid layer 906 is formed of a metal material, e.g., Cu, with a thickness of about 2~10 μm. Any of a variety of approaches may be used to form the lid layer 906 over the first dielectric layer 904, for example, an electroplating method.

Figure 9B:
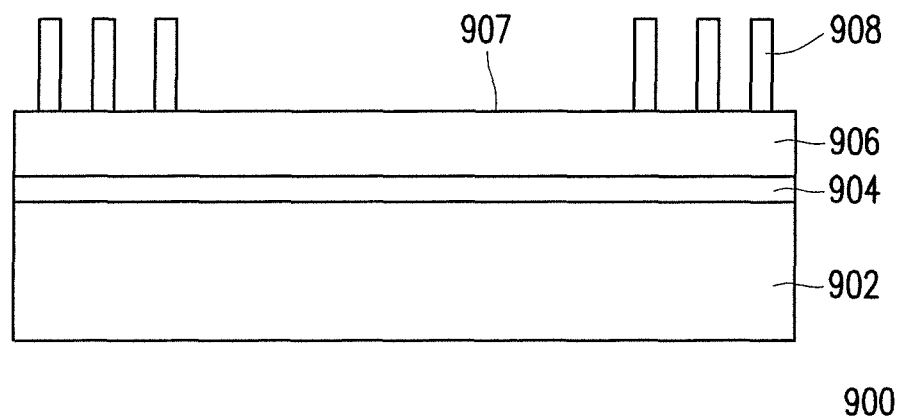

The method 800 continues to operation 804 in which a plurality of protruded structures 908 are formed on a top surface 907 of the lid layer 906, as shown in FIG. 9B. In some embodiments, the plurality of protruded structures 908 may be arranged as the contoured pillars 706 as shown in FIG. 7A, and/or the honeycomb grid 756 as shown in FIG. 7B. In some embodiments, the plurality of protruded structures 908 may be similarly formed by the operations 106-108 as described in the method 100 of FIG. 1. For brevity, the forming of the protruded structures 908 is described briefly herein: similar to the operation 106, forming a patterned layer (e.g., a patterned dielectric layer similar to 204 of FIG. 2B) over the lid layer 906, wherein the patterned layer includes a plurality of openings that each corresponds to a location of one of the protruded structures 908; and similar to the operation 108, filling the openings with the metal material used to form the lid layer 906, e.g., Cu in this example, and then removing the patterned layer from the lid layer 906.

Figure 9C:
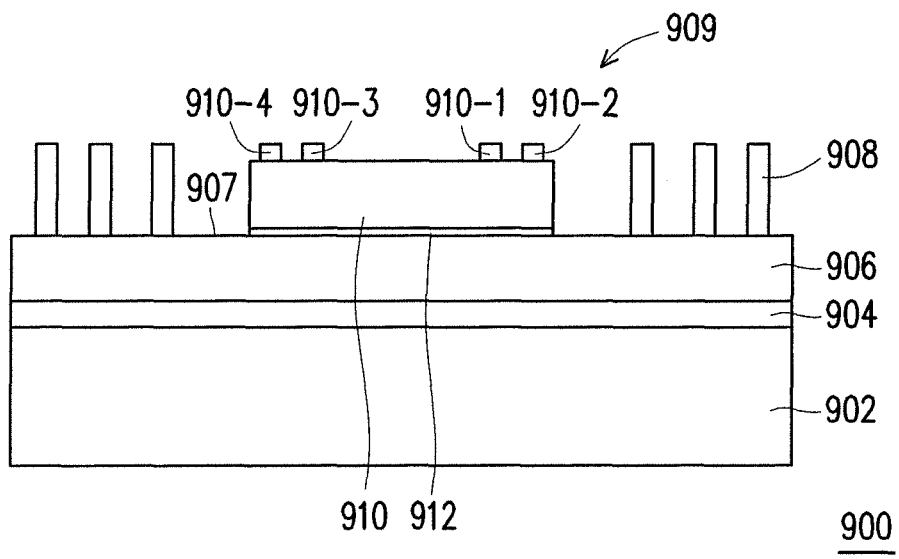

The method 800 continues to operation 806 in which a device substrate 910 is attached to the top surface 907 of the lid layer 906 and disposed within a lumen 909 formed by the protruded structures 908, as shown in FIG. 9C. In some embodiments, the device substrate 910 is attached to the lid layer 906 by a substantially similar operation to the operation 110 as described in the method 100 of FIG. 1. For example: a backside of the device substrate 910, e.g., a side opposite of electrical contacts 910-1, 910-2, 910-3, 910-4, etc., is disposed on the top surface 907 of the lid layer 906 using, for example, a die attach film (DAF) 912 or other adhesive layers. After the operation 806, it is noted that a top view of the FO structure 900 may look substantially similar to either of the exemplary layouts of FIGS. 7A and 7B.

Figure 9D:
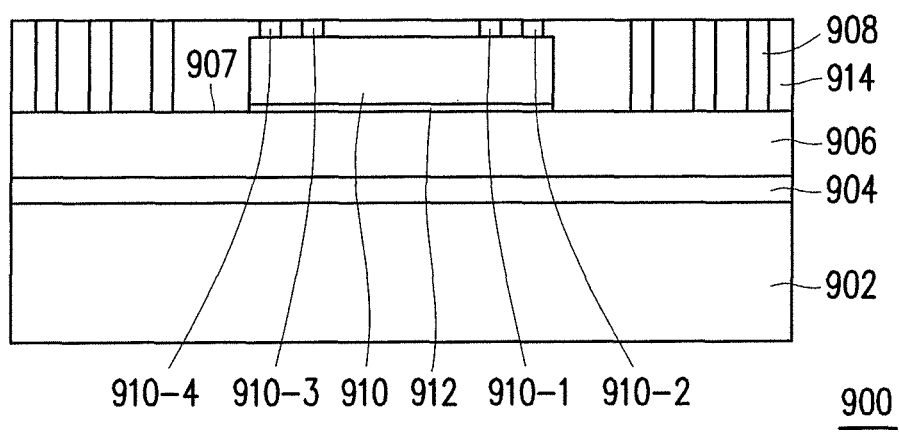

The method 800 continues to operation 808 in which a second dielectric layer 914 is formed over the device substrate 910 and the protruded structures 908, as shown in FIG. 9D. The second dielectric layer 914 may include a molding compound. For example, the second dielectric layer 914 is formed of a material that is selected from: an epoxy molding compound (EMC) material, a molded underfill (MUF) material, an ajinomoto build-up film (ABF) material, an ABF-based material, a resin material, or a combination thereof. In some embodiments, the second dielectric layer 914 is formed over the device substrate 910 and the protruded structures 908 by using at least one of: PVD, CVD, ALD, ECD, MBE, or a combination thereof. In some embodiments, it may be desirable to perform an etching or planarization process (e.g., a chemical mechanical polishing (CMP) process) to remove excess material, as described above, from a top surface of the electrical contacts (e.g., 910-1, 910-2, 910-3, 910-4, etc.) of the device substrate 910 and/or a top surface of the protruded structures 908 so as to expose the top surface(s).

Figure 9E:
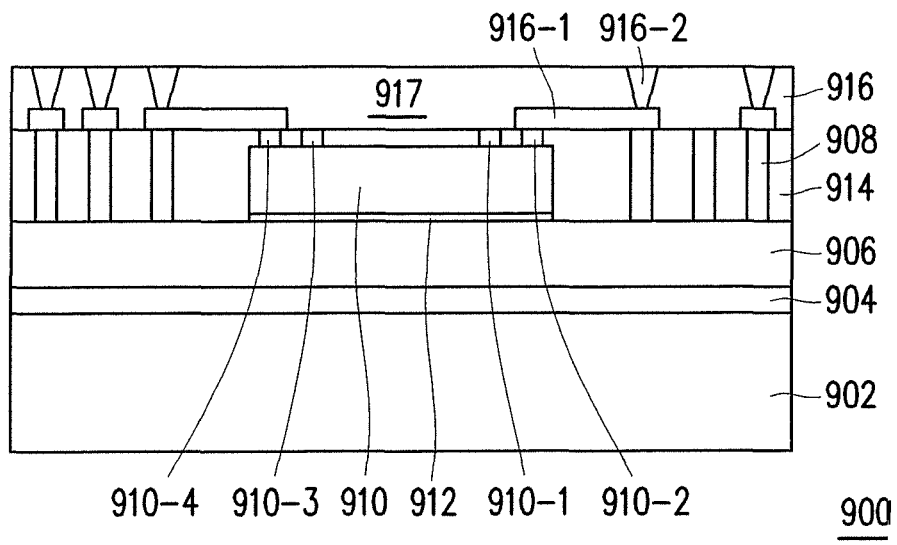

The method 800 continues to operation 808 in which an RDL layer 916 is formed over the second dielectric layer 914, as shown in FIG. 9E. In some embodiments, the RDL layer 916 includes one or more conductive lines 916-1 and one or more vias 916-2. The RDL layer 916 is formed to provide electrical connections between the vias 908 and the device substrate 910, through the electrical contacts (e.g., 910-1, 910-2, 910-3, 910-4, etc.), in accordance with various embodiments. More specifically, for example, the conductive line 916-1 of the RDL layer 916 is configured to provide an electrical connection between the electrical contact 910-2 and the via 908, and the via 916-2, electrically coupled to the conductive line 916-1, is configured to provide an electrical connection to one or more layer formed structures (e.g., BGA balls 918), which will be described in further detail below with respect to FIG. 9F.

Referring still to FIG. 9E, the RDL layer 916 may comprise a layer of a dielectric layer 917 (e.g., a passivation layer) having one or more conductive layers (e.g., the conductive line 916-1, the via 916-2, etc.) formed therein. The dielectric layer 917 may comprise, for example, a polymer material, such as epoxy, polyimide, polybenzoxazole (PBO), and the like, or may be formed of commonly known dielectric materials, such as spin-on glass, silicon oxide, silicon oxynitride, or the like, formed by any suitable method such as spin coating. In some embodiments, the RDL layer 916 may be formed by at least one of the following steps: the conductive lines 916-1 are first disposed over the second dielectric layer 914 to provide desirable connections to and/or between the vias 908 and contacts (910-1, 9102-2, 910-3, 910-4, etc.), as illustrated in FIG. 9E; the dielectric layer 917 is then disposed over the conductive lines 916-1 and the second dielectric layer 914; the vias 916-2 are subsequently formed within the dielectric layer 917 to form the RDL layer 916. After the forming of the RDL layer 916, an etching or planarization process (e.g., a chemical mechanical polishing (CMP) process) may be performed to remove excessive RDL layer 916 so as to expose a top surface of the via 916-2.

Figure 9F:
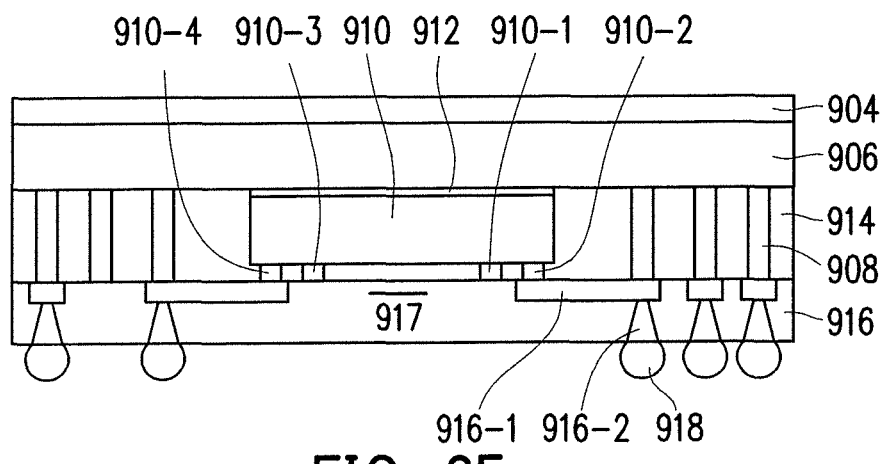

Referring now to FIG. 8 and FIG. 9F, the method 800 continues to operation 812 in which one or more solder contacts 918 (e.g., BGA balls) are formed over the RDL layer 916, and the carrier substrate 902 is removed from the dielectric layer 904 and the lid layer 906, in accordance with various embodiments. It is noted that the illustrated embodiment of FIG. 9F is shown in an upside-down manner. The solder contacts 918 can be formed using any known technique to provide an electrical connection to and/or between the RDL layer 914 and another carrier substrate or layer (e.g., another FO structure). Although in the illustrated embodiment of FIG. 9F, the solder contact 918 is in a sphere-based shape (e.g., a solder ball or a BGA ball), the solder contact 918 may be formed in a variety of shapes suitable for providing an electrical contact between two structures or points of contact. In some embodiments, the solder contact 918 may be formed of gold (Au), silver (Ag), nickel (Ni), tungsten (W), aluminum (Al), and/or alloys thereof.

Figure 10:
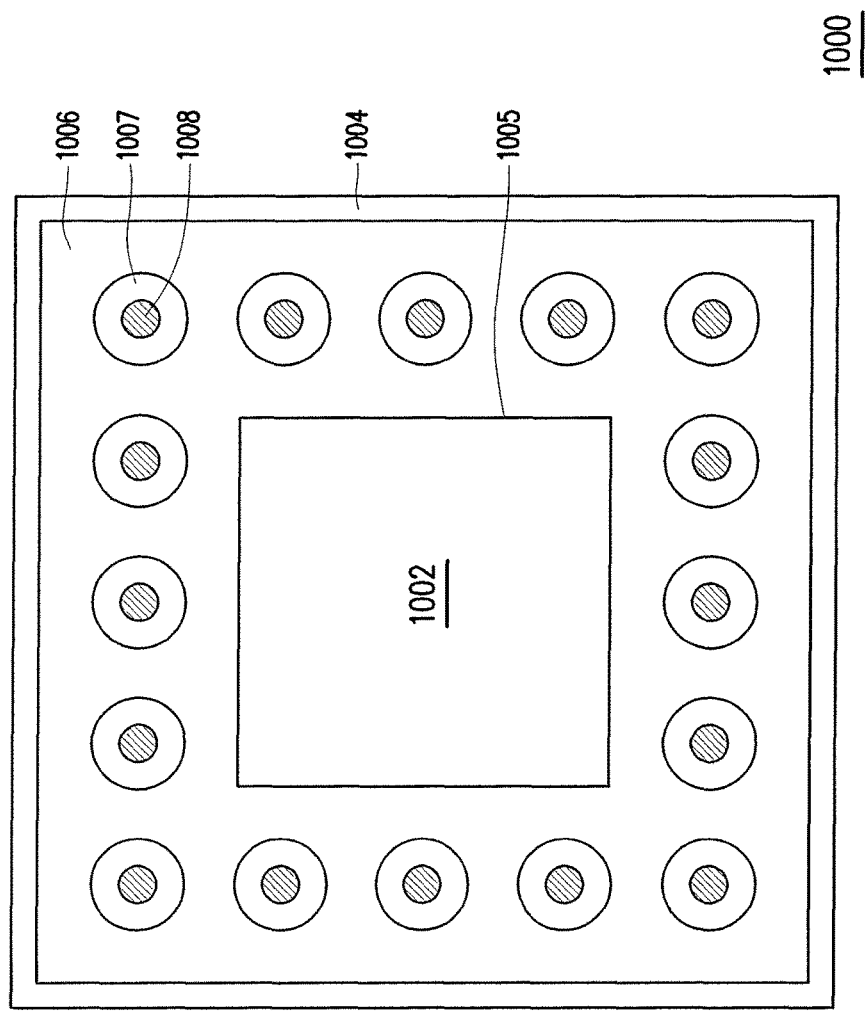
FIG. 10 illustrates a top view of an exemplary layout of another lid layer, in accordance with some embodiments of the present disclosure.

FIG. 10 illustrates an alternative embodiment of a sub FO structure 1000 that includes a lid layer 1004 disposed beneath a device substrate 1002 and the lid layer 1004 further includes an array of holes 1007 each for disposing a via 1008 therein, in accordance with various embodiments. Similar to the sub FO structure 700 of FIG. 7A, the device substrate 1002 is attached to the lid layer 1004 and disposed within a lumen (e.g., 1005) formed by a protruded structure 1006, and the protruded structure 1006 extends out of a plane of the lid layer 1004. That is, the protruded structure 1006 is formed of a metal material similar to the lid layer 1004 such as Cu. However, in this specific embodiment, the protruded structure 1006 is formed to include the array of holes 1007, wherein the array of holes 1007 is configured to surround the device substrate 1002 and each of the holes is configured to be filled with a via 1008, as shown in FIG. 10. In some embodiments, the protruded structure 1006 may provide optimized heat dissipation while the via 1008 can still be used to provide electrical connection(s).

One of the advantages is that the present disclosure offers a novel way of packaging multiple device substrates (i.e., IC chips) by forming an embedded Cu pillar in a package/FO structure that packages the device substrate. As discussed above, by packaging each of a plurality of device substrates as a package or a FO structure that includes one or more embedded Cu pillars, the plurality of device substrates may be directly stacked together and thus electrically coupled to one another. Further, using the embedded Cu pillar(s) to couple to another FO structure or package may in turn increase the number of electrical contact on a limited real estate, reduce an impedance of a formed electrical connection path, etc., as described above.

The present disclosure provides a packaged device that includes a first dielectric layer; a second dielectric layer, formed over the first dielectric layer, that includes a device substrate and a via extending from the first dielectric layer and through the second dielectric layer; and a third dielectric layer, formed over the second dielectric layer, that includes a conductive pillar extending through the third dielectric layer, wherein the conductive pillar is electrically coupled to the via of the second dielectric layer.

The present disclosure provides a packaged device that includes a package comprising: a first solder contact; a first redistribution line (RDL) layer formed over the first solder contact; a first dielectric layer, formed over the first RDL layer, that includes a first device substrate and a first via extending from the first RDL layer and through the first dielectric layer; and a second dielectric layer, formed over the first dielectric layer, that includes a first conductive pillar extending through the second dielectric layer; and a fan out structure comprising: a second RDL layer formed over the second dielectric layer of the package; and a third dielectric layer, formed over the second RDL layer, that includes a second device substrate, wherein the second device substrate is electrically coupled to the first solder contact through the second RDL layer, the first conductive pillar, the first via of the first dielectric layer, and the first RDL layer.

The present disclosure provides a method to form a packaged device. The method includes: providing a first dielectric layer formed over a first carrier substrate; forming a via over the first dielectric layer; attaching a device substrate to the first dielectric layer; forming a second dielectric layer over the first dielectric layer; forming a first redistribution line (RDL) layer over the second dielectric layer; forming a conductive pillar extending through the first dielectric layer, wherein the conductive pillar is electrically coupled to the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A packaged device, comprising:
a first dielectric layer containing at least one conductive line;
a second dielectric layer, formed over the first dielectric layer, that contains an integrated circuit (IC) device substrate and a via extending from the first dielectric layer and through the second dielectric layer; and
a third dielectric layer, formed over the second dielectric layer, that includes a conductive pillar extending through the third dielectric layer,
wherein the via of the second dielectric layer is disposed between and electrically couples the conductive pillar in the third dielectric layer and the at least one conductive line in the first dielectric layer, and wherein the first, second and third dielectric layers are each contained within a single packaged device.

2. The device of claim 1, wherein the conductive pillar is configured as an electrical contact of the packaged device.

3. The device of claim 1, wherein the conductive pillar and the via of the second dielectric layer include a copper material.

4. The device of claim 1, wherein the second dielectric layer includes at least one of: an epoxy molding compound (EMC) material, a molded underfill (MUF) material, an ajinomoto build-up film (ABF) material, an ABF-based material, a resin material, or a combination thereof.

5. The device of claim 1, wherein the third dielectric layer includes at least one of: a polymide, a polybenzoxazole (PBO), a PBO-based dielectric material, a benzocyclobutene (BCB), a BCB-based dielectric material, or a combination thereof.

6. The device of claim 1, wherein the at least one conductive line is configured to electrically couple the device substrate and the via of the second dielectric layer.

7. The device of claim 1, further comprising:
at least one solder contact disposed on one surface of the first dielectric layer that is opposite from the other surface of the first dielectric layer on which the second dielectric layer is disposed.

8. The device of claim 7, further comprising:
a carrier substrate coupled to the packaged device through the at least one solder contact.

9. A packaged device, comprising:
a package comprising:
a first solder contact;
a first redistribution line (RDL) layer formed over the first solder contact;
a first dielectric layer, formed over the first RDL layer, that includes a first device substrate and a first via extending from the first RDL layer and through the first dielectric layer; and
a second dielectric layer, formed over the first dielectric layer, that includes a first conductive pillar extending through the second dielectric layer; and
a fan out structure comprising:
a second RDL layer formed over the second dielectric layer of the package; and
a third dielectric layer, formed over the second RDL layer, that includes a second device substrate,
wherein the second device substrate is electrically coupled to the first solder contact through the second RDL layer, the first conductive pillar, the first via of the first dielectric layer, and the first RDL layer.

10. The device of claim 9, wherein the third dielectric layer of the fan out structure further includes a second via extending from the second RDL layer and through the third dielectric layer.

11. The device of claim 10, wherein the fan out structure further includes a fourth dielectric layer disposed over the third dielectric layer, and wherein the fourth dielectric layer includes a second conductive pillar extending through the fourth dielectric layer.

12. The device of claim 11, wherein the second conductive pillar is configured to electrically couple the second via and the second RDL layer.

13. The device of claim 12, wherein the first and second conductive pillars each includes a copper material.

14. The device of claim 9, wherein the fan out structure further includes a second solder contact disposed opposite the second RDL layer from the third dielectric layer.

15. The device of claim 14, wherein the second solder contact is configured to electrically couple the second device substrate to the first conductive pillar through the second RDL layer.

16. A packaged device, comprising:
a first solder contact;
a first redistribution line (RDL) layer formed over the first solder contact;
a first dielectric layer, formed over the first RDL layer, that includes a first via extending from the first RDL layer and through the first dielectric layer;
a second dielectric layer, formed over the first dielectric layer, that includes a first conductive pillar extending through the second dielectric layer;
a second RDL layer formed over the second dielectric layer of the package; and
a third dielectric layer, formed over the second RDL layer, that includes a device substrate, wherein the device substrate is electrically coupled to the first solder contact through the second RDL layer, the first conductive pillar, the first via of the first dielectric layer, and the first RDL layer.

17. The device of claim 16, wherein the third dielectric layer further includes a second via extending from the second RDL layer and through the third dielectric layer.

18. The device of claim 17, wherein the fan out structure further includes a fourth dielectric layer disposed over the third dielectric layer, and wherein the fourth dielectric layer includes a second conductive pillar extending through the fourth dielectric layer.

19. The device of claim 18, wherein the second conductive pillar is configured to electrically couple the second via and the second RDL layer.

20. The device of claim 19, wherein the first and second conductive pillars each includes a copper material.

* * * * *